(12) United States Patent
Wu

(10) Patent No.: US 8,058,888 B2
(45) Date of Patent: Nov. 15, 2011

(54) TEST APPARATUS FOR ELECTRONIC DEVICE PACKAGE AND METHOD FOR TESTING ELECTRONIC DEVICE PACKAGE

(75) Inventor: Shun-Ker Wu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 263 days.

(21) Appl. No.: 12/578,501

(22) Filed: Oct. 13, 2009

(65) Prior Publication Data

US 2011/0084720 A1    Apr. 14, 2011

(51) Int. Cl.
*G01R 31/00* (2006.01)
*G01R 31/20* (2006.01)

(52) U.S. Cl. .......... 324/756.02; 324/756.01; 324/754.09

(58) Field of Classification Search .. 324/762.01–762.1, 324/754.01–754.3, 756.01–756.07; 439/266, 439/74, 70
See application file for complete search history.

(56) References Cited

U.S. PATENT DOCUMENTS

| 4,771,234 A | * | 9/1988 | Cook et al. | 324/750.2 |
| 6,354,844 B1 | * | 3/2002 | Coico et al. | 439/66 |
| 7,138,811 B1 | * | 11/2006 | Mahoney et al. | 324/750.14 |

* cited by examiner

*Primary Examiner* — Huy Q Phan
*Assistant Examiner* — Tung X Nguyen

(57) ABSTRACT

A test apparatus for an electronic device package is provided, which includes a test socket having a first portion with a recess for receiving an electronic device package having external terminals arranged in a terminal configuration and a second portion. An interchangeable insert board is disposed between the first portion and the second portion and extended on the recess, which includes first contact pads arranged in a first pad configuration compatible with the terminal configuration and facing the recess and second contact pads arranged in a second pad configuration and disposed between the first and the second portions. Trace layers each electrically connects one of the first contact pads to one of the second contact pads. The contact pins each penetrates through the second portion and electrically connects to one of the second pads, wherein the contact pins are arranged in a pin configuration compatible with the second pad configuration.

20 Claims, 10 Drawing Sheets

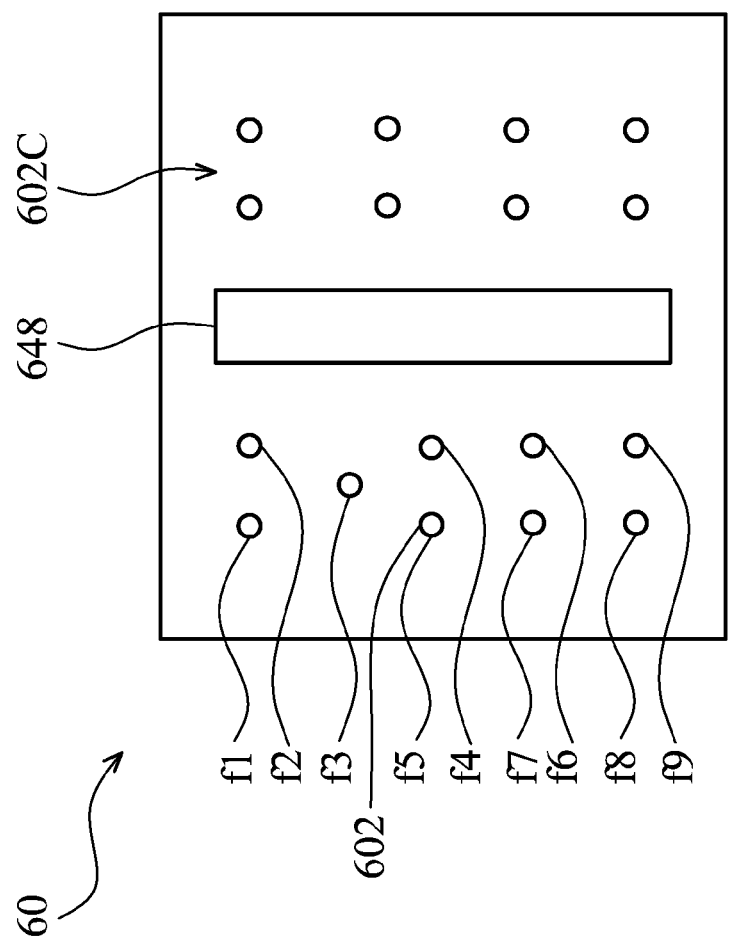

TEST APPARATUS FOR ELECTRONIC DEVICE PACKAGE AND METHOD FOR TESTING ELECTRONIC DEVICE PACKAGE

BACKGROUND OF THE INVENTION

1. Field of the Invention

The present invention relates to a test apparatus for an electronic device package and method for testing an electronic device package, and in particular relates to a test apparatus for an electronic device package and method for testing a BGA electronic package.

2. Description of the Related Art

Technological development in the semiconductor industry has continued to be driven by Moore's Law and miniaturization. Thus, along with miniaturization, functionality of semiconductor devices has also increased. However, with miniaturization and increased functionality, the density of semiconductor I/O pins has increased, thereby making it difficult for the semiconductors to be packaged.

Thus, a ball grid array (BGA) package has been developed to package advanced semiconductor devices. One advantage of the BGA packages over more conventional lead frame packages include higher operating efficiency due to shorter signal transmitting distances of the BGA package. Specifically, the spherical pins of the BGA package have a shorter pitch than that of a lead frame package. Meanwhile, the solder balls of the BGA package may be arranged according to requirement.

Devices implementing BGA packages may be subjected to electrical and/or reliability tests. Such tests may employ a test socket used to receive the solder balls of the BGA package to provide electrical access to the devices. For example, pogo pins directly contacting the solder balls may be used between the BGA package and a test machine. Usually, the test socket needs to be coupled to the test machine through an interface printed circuit board to analyze the electrical data from the BGA package. Thus, if the arrangement of the solder balls of the BGA package is changed, the test socket as well as the interface printed circuit board may also need to be changed. Specifically, if the arrangement of the solder balls for the BGA package is changed, the distribution of the pogo pins for the test machine or test element, may also need to be altered and/or rebuilt. Thus, in such a case, costs would increase.

BRIEF SUMMARY OF THE INVENTION

According to an illustrative embodiment, a test apparatus for an electronic device package is provided. The apparatus comprises a test socket having a first portion and a second portion overlying the first portion, wherein the first portion has a recess for receiving an electronic device package to be tested, which has a plurality of external terminals arranged in a terminal configuration; and an interchangeable insert board disposed between the first portion and the second portion and partially extended on the recess, wherein the interchangeable insert board comprises a plurality of first contact pads arranged in a first pad configuration compatible with the terminal configuration and facing the recess. A plurality of second contact pads arranged in a second pad configuration and disposed between the first portion and the second portion of the test socket and a plurality of trace layers each electrically connecting one of the first contact pads to one of the second contact pads, respectively are also provided. Also, a plurality of contact pins each penetrating through the second portion of the test socket and electrically connected to one of the second contact pads of the interchangeable insert board, wherein the contact pins are arranged in a pin configuration and compatible to the second pad configuration.

According to another illustrative embodiment, a method for testing an electronic device package is provided. The method comprises: providing a first electronic device package to be tested having a plurality of first external terminals arranged in a first terminal configuration; providing a test socket having a first portion and a second portion overlying the first portion, wherein the first portion has a recess for receiving an electronic device package to be tested; disposing an interchangeable insert board between the first portion and the second portion of the test socket, wherein the interchangeable insert board is partially extended on the recess and comprises a plurality of first contact pads arranged in a first pad configuration compatible with the first terminal configuration and facing the recess; a plurality of second contact pads arranged in a second pad configuration and disposed between the first portion and the second portion of the test socket; and a plurality of trace layers each electrically connecting one of the first contact pads to one of the second contact pads, respectively; providing a plurality of contact pins each penetrating through the second portion of the test socket and electrically connected to one of the second contact pads of the interchangeable insert board, wherein the contact pins are arranged in a pin configuration, and wherein the second pad configuration is compatible with the pin configuration; and disposing the first electronic device package into the recess to make each of the first external terminals electrically connected to one of the first contact pads, respectively.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 5A to 5C are illustrative top views of an electronic device package to be tested according to embodiments of the present invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many difference embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on", "overlying", (and like descriptions) a second layer include embodiments where the first and second layers are in direct contact and those where one or more layers are interposing the first and second layers.

Figure 1:
FIG. 1 is an illustrative cross-sectional view of a test apparatus for an electronic device package according to an embodiment of the present invention.

FIG. 1 shows an illustrative cross-sectional view of a test apparatus 10 for an electronic device package in accordance with an embodiment of the present invention. The apparatus 10 comprises a test socket 12 for holding an electronic device package to be tested and an interchangeable insert board 14 for providing an electrical path between the held electronic device package to be tested and a test machine. The test socket 12 has a first portion 121 and a second portion 122 disposed overlying the first portion 121. The test socket 12 may include an insulating material such as a polymer material, ceramic material, or combinations thereof. In this embodiment, the first portion 121 of the test socket 12 has a recess 124 (or a space) for receiving an electronic device package to be tested. A bottom portion 124a of the recess 124 may be used to support an electronic device package to be tested. The first portion 121 and the second portion 122 of the test socket 12 may be linked with each other by any conventional fixer (not shown in the figure) known by one skilled in the art. It is preferable that the first portion 121 and the second portion 122 can be easily separated and linked back together. It is preferably that the fixer is capable of controlling the spacing between the first portion 121 and the second portion 122. As will be described in the following description, the spacing between the first portion 121 and the second portion 122 of the test socket 12 is used to contain the interchangeable insert board 14.

Usually, during electrical and/or reliability tests of an electronic device package, the electronic device package needs to be heated or cooled to a predetermined temperature to obtain electrical data for analysis. In this case, the first portion 121 may comprise a heat transfer element 121a for conducting heat energy to or from an electronic device package to be tested, as shown in FIG. 1. The heat transfer element 121a may be a plate capable of increasing or decreasing its surface temperature. When an electronic device package is disposed in the recess 124, the electronic device package to be tested may directly contact with a top surface of the heat transfer element 121a. Thus, a testing temperature of the electronic device package to be tested may be adjusted depending on requirements, by controlling the surface temperature of the heat transfer element 121a. In this case, the top surface of the heat transfer element 121a is also the bottom portion 124a of the recess 124. However, the embodiment of the invention is not limited to the specific example mentioned above. In another embodiment, there may be one or more material layers formed on the top surface of the heat transfer element 121a.

As shown in FIG. 1, the interchangeable insert board 14 is disposed between the first portion 121 and the second portion 122 of the test socket 12. Preferably, the interchangeable insert board 14 is fixed between the first portion 121 and the second portion 122. However, if necessary, the interchangeable insert board 14 can be removed by partially or completely separating the first portion 121 and the second portion 122. A new interchangeable insert board may then be disposed between the first portion 121 and the second portion 122, depending on requirements. In addition, a portion of the interchangeable insert board 14 is extended on the recess 124. Thus, a portion of a surface of the interchangeable insert board 14 is facing the recess 124.

Figure 2:
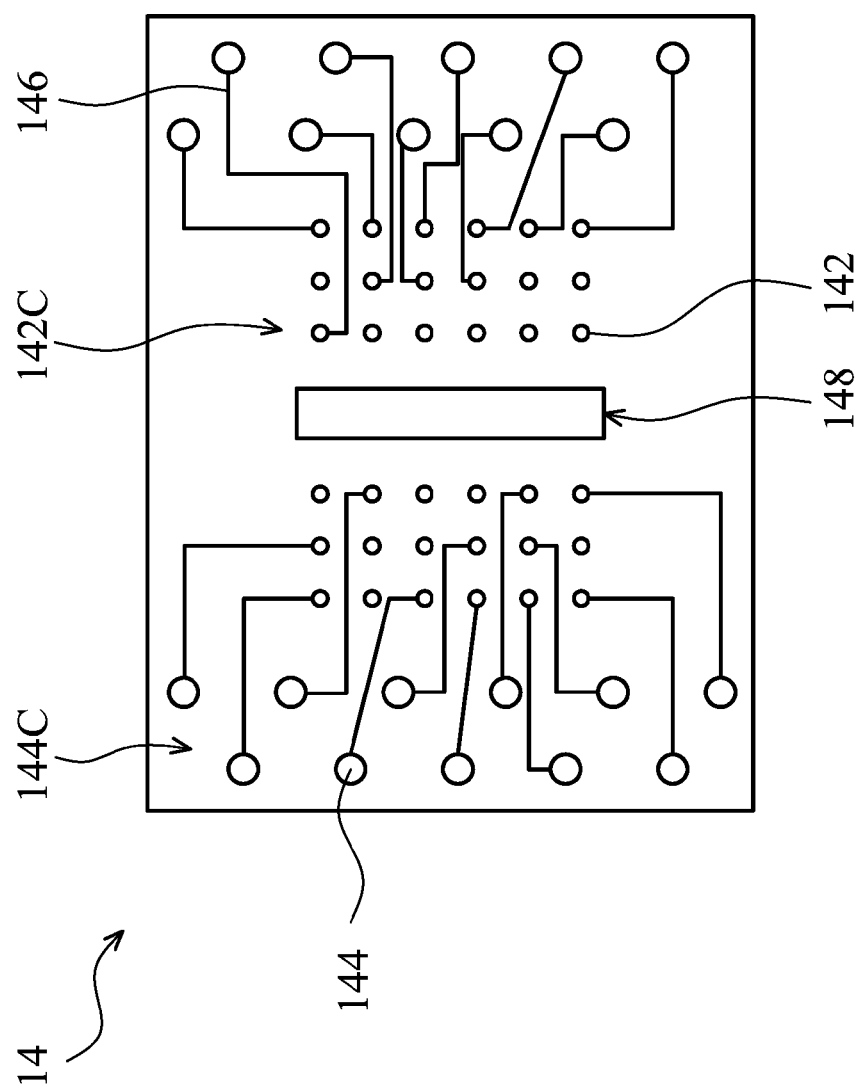
FIG. 2 is an illustrative top view of an interchangeable insert board according to an embodiment of the present invention.

The interchangeable insert board 14 may be an insulating board having interconnection patterns formed therein, such as a printed circuit board. FIG. 2 shows an illustrative top view of an interchangeable insert board 14 in accordance with an embodiment of the present invention. As shown in FIGS. 1 and 2, the interchangeable insert board 14 comprises a plurality of first contact pads 142 located on a surface of the interchangeable insert board 14 facing the recess 124. The first contact pads 142 are arranged in a first pad configuration 142c. The first pad configuration 142c is designed to be compatible with a terminal configuration of an electronic device package to be tested. In addition, because the first contact pads 142 are facing the recess 124 and compatible with the terminal configuration of the electronic device package to be tested, when an electronic device package to be tested is disposed into the recess 124, the first contact pads 142 can electrically contact with the external terminals of the electronic device package to be tested. Usually, the first contact pads 142 are formed on the surface facing the recess 124. However, in another embodiment, the first contact pads 142 may completely penetrate the interchangeable insert board 14.

The interchangeable insert board 14 also comprises a plurality of second contact pads 144 disposed at an outer region of the interchangeable insert board 14. When the interchangeable insert board 14 is disposed between the first portion 121 and the second portion 122 of the test socket 12, the second contact pads 144 are also disposed between the first portion 121 and the second portion 122 of the test socket 12. The second contact pads 144 are arranged in a second pad configuration 144c. In the embodiment shown in FIG. 2, the first pad configuration 142c and the second pad configuration 144c are different (different pad patterns). However, in another embodiment, it is possible that the pattern of the first pad configuration 142c and the second pad configuration 144c are substantially the same patterns disposed at different regions of the interchangeable insert board 14. Usually, the second contact pads 144 are formed on the surface facing the second portion 122 of the test socket 12. However, in another embodiment, the second contact pads 144 may completely penetrate the interchangeable insert board 14.

As shown in FIG. 2, the interchangeable insert board 14 also comprises a plurality of trace layers 146 each forming an electrical connection between a specific first contact pad 142 and a specific second contact pad 144. Specifically, each of the trace layers 146 electrically connects one of the first contact pad 142 to one of the second contact pad 144, respectively. A specific first contact pad can be electrically connected to a specific second contact pad through a specific trace layer. In addition, in some embodiments, some of the first contact pads 142 may not be electrically connected to any trace layer. The trace layers 146, the first contact pads 142, and the second contact pads 144 are made of conducting materials, such as aluminum, copper, gold, and so on. The interchangeable insert board 14 may be formed by any conventional technology used for forming a printed circuit board, including a metal deposition and patterning process.

Referring to FIGS. 1 and 2, the interchangeable insert board 14 may optionally comprise an opening 148 exposing the recess 124. When an electronic device package is disposed in the recess 124, an optional internal probing test may be performed. An internal probe pin may be used to contact with the electronic device package to be tested through the opening 148.

Referring to FIG. 1, the test apparatus 10 also comprises a plurality of contact pins 16. Each of the contact pins 16 penetrates through the second portion 122 of the test socket 12 and is electrically connected to one of the second contact pads 144 of the interchangeable insert board 14. The contact pins 16 are arranged in a pin configuration 16c. The contact pins 16 may include, but is not limited to, a pogo pin or other suitable metal pins. In one embodiment, a plurality of through-holes arranged in a desired pin configuration is formed in the second portion 122 of the test socket 12. Thus, the contact pins 16 are disposed into the through-holes and arranged in the pin configuration 16c. In this embodiment, the second pad configuration 144c of the second contact pads 144 is compatible with the pin configuration 16c of the contact pins 16. Thus, each contact pin 16 electrically contacts with a corresponding second pad 144 since the pin configuration 16c and the second pad configuration 144c are compatible with each other. That is, the distribution of the contact pins 16 and the distribution of the second contact pads 144 are substantially the same. In one embodiment, one end of each of the contact pins 16 may directly contact with the corresponding second contact pad 144 and the opposite end of each of the contact pins 16 may be exposed on an upper surface of the second portion 122 of the test socket 12. In one embodiment, the opposite ends of the contact pins 16 protrude from the upper surface of the second portion 122 of the test socket 12. The protruded or exposed ends of the contact pins 16 may be coupled to other electrical elements or machines to receive other test elements for testing the electrical properties of an electronic device package to be tested through an electrical path from the first contact pad 142, the trace layer 146, the second contact pad 144, and the contact pin 16.

Figure 3:
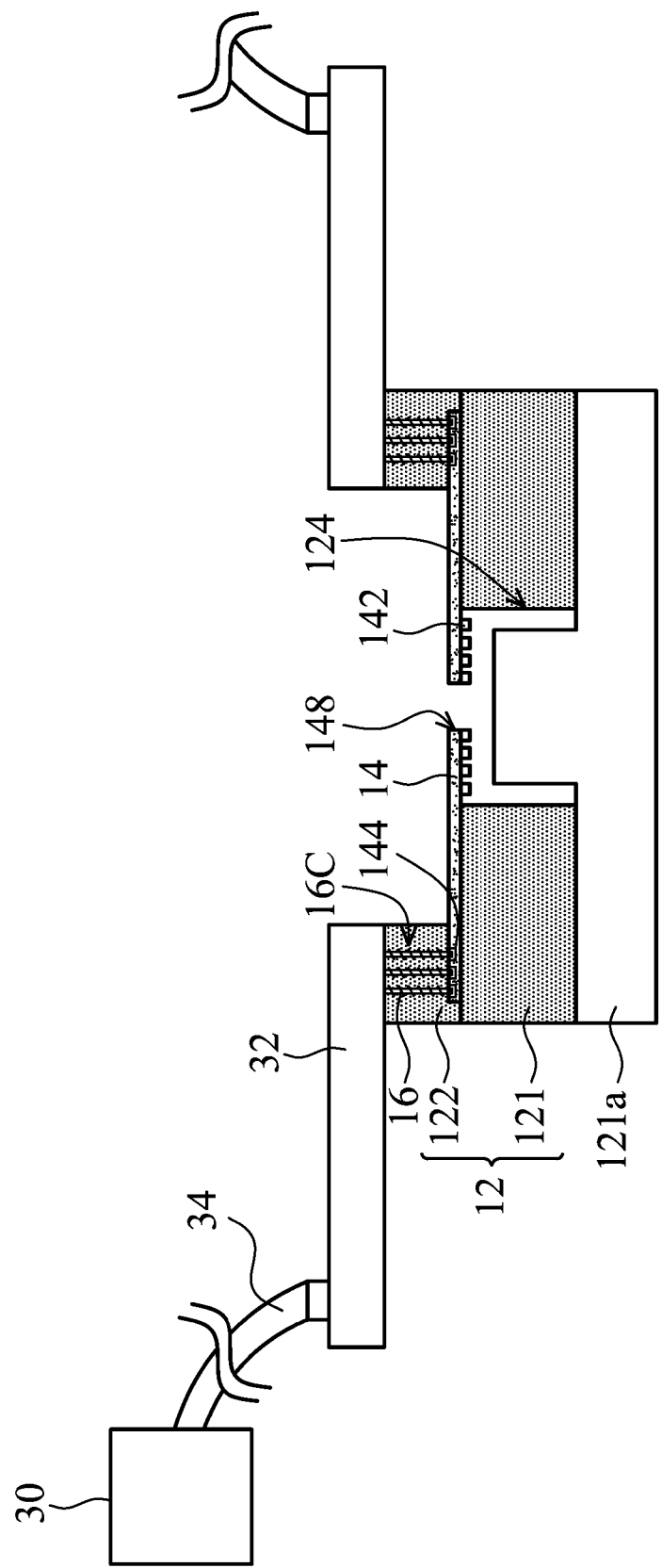
FIG. 3 is an illustrative cross-sectional view of a test apparatus for an electronic device package according to an embodiment of the present invention.

As shown in FIG. 3, the test apparatus 10 may further comprise an interface printed circuit board 32 electrically connected to the contact pins 16 and a test machine 30 electrically coupled to the interface printed circuit board 32. For example, the test machine 30 may be electrically coupled to the interface printed circuit board 32 through, but is not limited to, cable lines 34. Thus, in this embodiment, electrical signals may be transmitted between the test machine 30 and an electronic device package to be tested through the interchangeable insert board 14, the contact pins 16, the interface printed circuit board 32, and the cable lines 34.

Figure 4A:
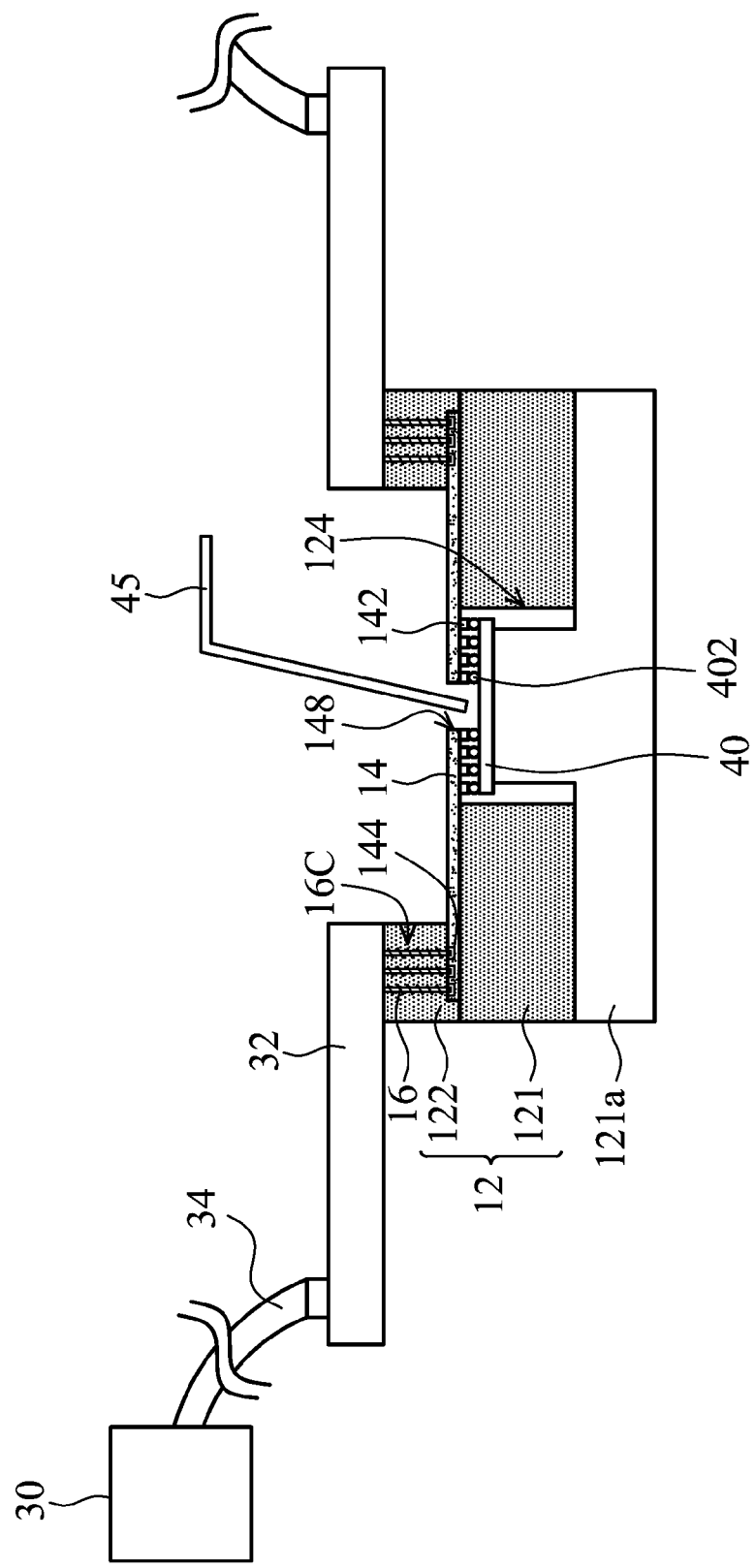
FIGS. 4A and 4B are illustrative cross-sectional views of a test apparatus for an electronic device package according to embodiments of the present invention.

FIG. 4A shows an illustrative cross-sectional view of a test apparatus 10 for an electronic device package with an electronic device package disposed therein for testing in accordance with an embodiment of the present invention. A method for testing an electronic device package according to an embodiment of the invention will be described with reference to FIGS. 4A, 5A-5B, and 6A.

Figure 5A:
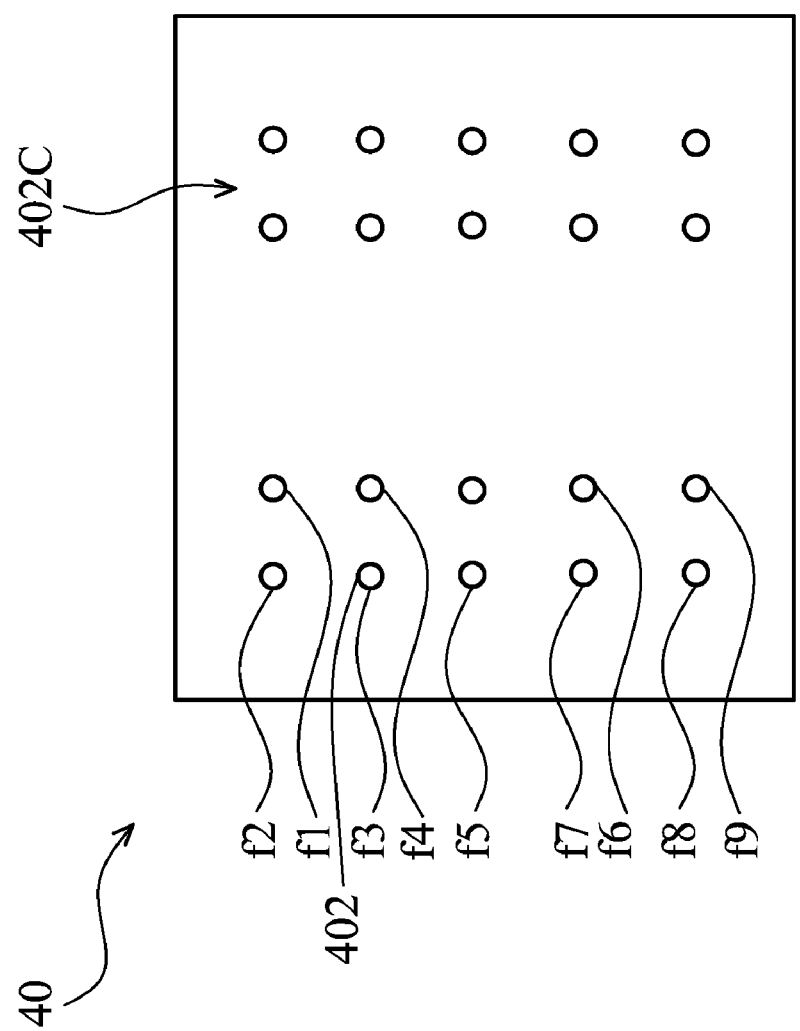

As shown in FIGS. 4A and 5A, a first electronic device package 40 to be tested is provided. The first electronic device package 40 has a plurality of first external terminals 402 arranged in a first terminal configuration 402c. FIG. 5A shows a top view of the backside of the first electronic device package 40. Each of the first external terminals 402 may have a specific function. The first external terminals 402 have different functions and labeled as, for example f1-f9, respectively. For example, one of the first external terminals 402 may be used as, but is not limited to, a command terminal, power terminal, ground terminal, and so on. In different electronic packages, the distribution or pitches of the external terminals may be different from each other. Also, in different electronic packages, when the distribution or pitches of the external terminals are the same from each other, the functions of the external terminals may be different.

The first electronic device package 40 to be tested may comprise, but is not limited to, a ball grid array (BGA) package or a pin grid array (PGA) package. For example, the first electronic device package 40 to be tested may comprise, but is not limited to, a DRAM package or another memory package. In addition, the first external terminals 402 may comprise, but is not limited to, solder balls or other similar metal bumps.

Then, a test apparatus 10 is provided. In this embodiment, a test apparatus 10 similar to that shown in FIG. 3 is provided. Similar or same reference numbers are used to designate similar or same elements. Then, an interchangeable insert board 14 is disposed between the first portion 121 and the second portion 122 of the test socket 12 and the first electronic device package 40 is disposed in the recess 124, wherein the first external terminals 402 are facing upwards to electrically contact with the first contact pads 142 extended on the recess 124.

Figure 6A:
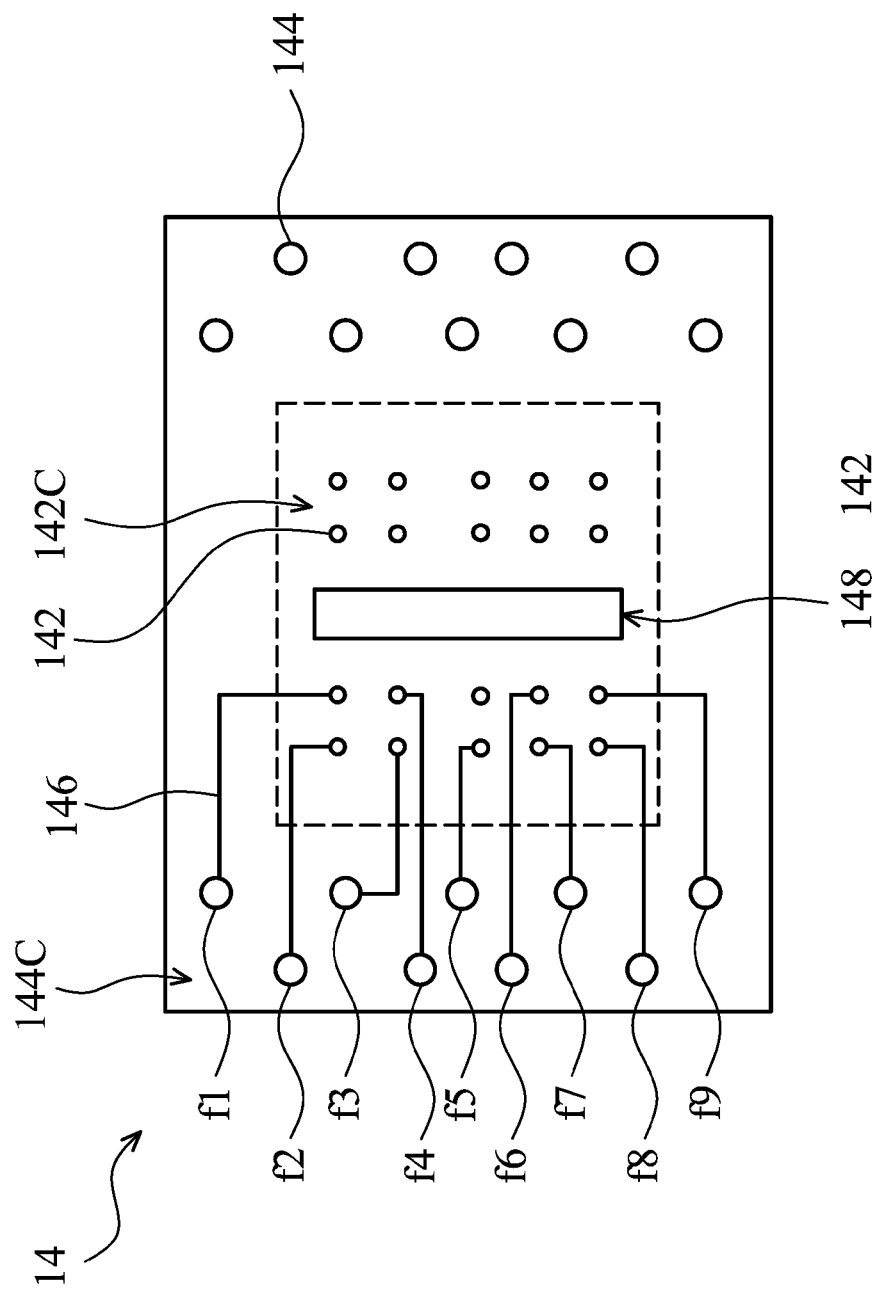
FIG. 6A to 6B are illustrative top views of an interchangeable insert board according to embodiments of the present invention.

FIG. 6A shows a top view of the interchangeable insert board 14. The interchangeable insert board 14 comprises a plurality of first contact pads 142 arranged in a first pad configuration 142c and facing the recess 124, wherein the first pad configuration 142c is compatible with the first terminal configuration 402c. The region surrounded by the dash line shown in FIG. 6A shows the location which the electronic device package 40 is disposed on.

The interchangeable insert board 14 also comprises a plurality of second contact pads 144 arranged in a second pad configuration 144c compatible with the pin configuration 16c of the contact pins 16. Each of the contact pins 16 electrically contacts with a specific second contact pad 144, which is electrically connected to a specific first contact pad 146 through a specific trace layer 146. For example, through a specific trace layer 146 and a specific first contact pad 142, the first external terminal 402 having a first function (f1) is electrically connected to a specific second contact pad 144 (also labeled as f1), which corresponds to a specific contact pin 16. Thus, each of the contact pins 16 is electrically coupled to a predetermined first external terminal 402 having a specific function. The first electronic device package 40 may thus be subjected to electrical and/or reliability tests by the test machine 30 through the electrical paths provided by the contact pins 16 and the interchangeable insert board 14.

During the tests of the first electronic device package 40, a plurality of electrical signals may be generated by the test machine 30 and transmitted to the corresponding first external terminals 402 of the electronic device package 40 through the cable lines 34, the interface printed circuit board 32, the contact pins 16, the second contact pads 144, the trace layers 146, and the first contact pads 142. Also, electrical signals from the electronic device package 40 are transmitted to the test machine 30 for further analysis. In one embodiment, the first electronic device package 40 is heated or cooled by the heat transfer element 121a during the testing process.

Figure 5B:
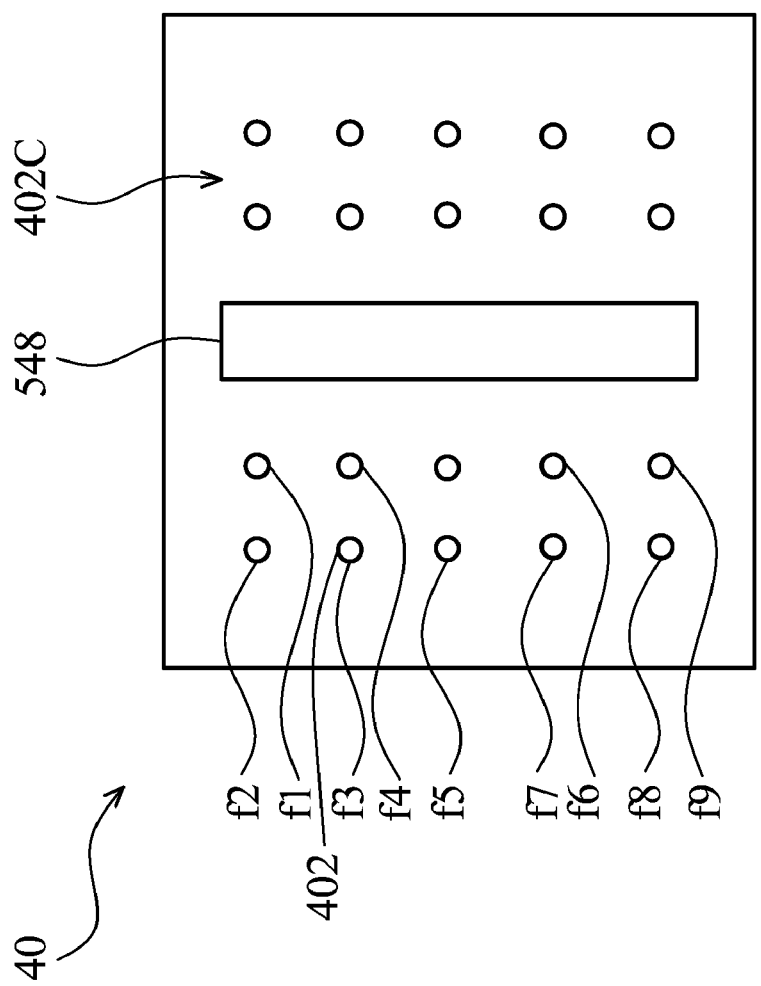

In another embodiment, an internal probing test may be optionally performed to the first electronic device package 40. In this case, an opening 148 may be formed in the interchangeable insert board 14 to expose a portion of the first electronic device package 40 to be tested. In addition, a probe opening 548 is formed through the exposed portion of the first electronic device package 40 to be tested, as shown in FIG. 5B. For example, a patterning process such as a photolithography process may be performed to form the probe opening 548. It should be appreciated that it is preferable that the location of the probe opening 548 does not overlap with the locations of the first external terminals 402. As shown in FIGS. 4A and 5B, an internal probe pin 45 is disposed into the opening 148 and the probe opening 548 (see FIG. 5B) to perform the internal probing test.

The test apparatus according to an embodiment of the invention can also be used to test another electronic device package having different external terminals. A method for testing a second electronic device package 60 other than the first electronic device package 40 according to an embodiment of the invention is described with reference to FIGS. 4B, 5C, and 6B. In this embodiment, all the elements except for the interchangeable insert board 14 do not need to be changed or modified to perform the test of the second electronic device package 60 having a different terminal configuration.

Referring to 4B, an electronic device package 60 other than the electronic device package 40 shown in FIG. 4A is tested. The first electronic device package 40 and the interchangeable insert board 14 are removed from the test apparatus first. Then, a second electronic device package 60 to be tested is provided. The second electronic device package 60 may comprise, but is not limited to, a BGA package or a PGA package. For example, the second electronic device package 60 may be a DRAM package.

FIG. 5C shows a top view of the backside of the second electronic device package 60, which has a plurality of second external terminals 602 arranged in a second terminal configuration 602c. Each of the second external terminals 602 may have a specific function. According to different functions of the second external terminals 602, the second external terminals 602 are also labeled as, for example f1-f9, respectively. For example, one of the second external terminals 602 may be used as, but is not limited to, a command terminal, power terminal, ground terminal, and so on. The definition and/or distribution of the second external terminals 602 of the second electronic device package 60 are different from those of the first external terminals 402 of the first electronic device package 40.

Figure 4B:
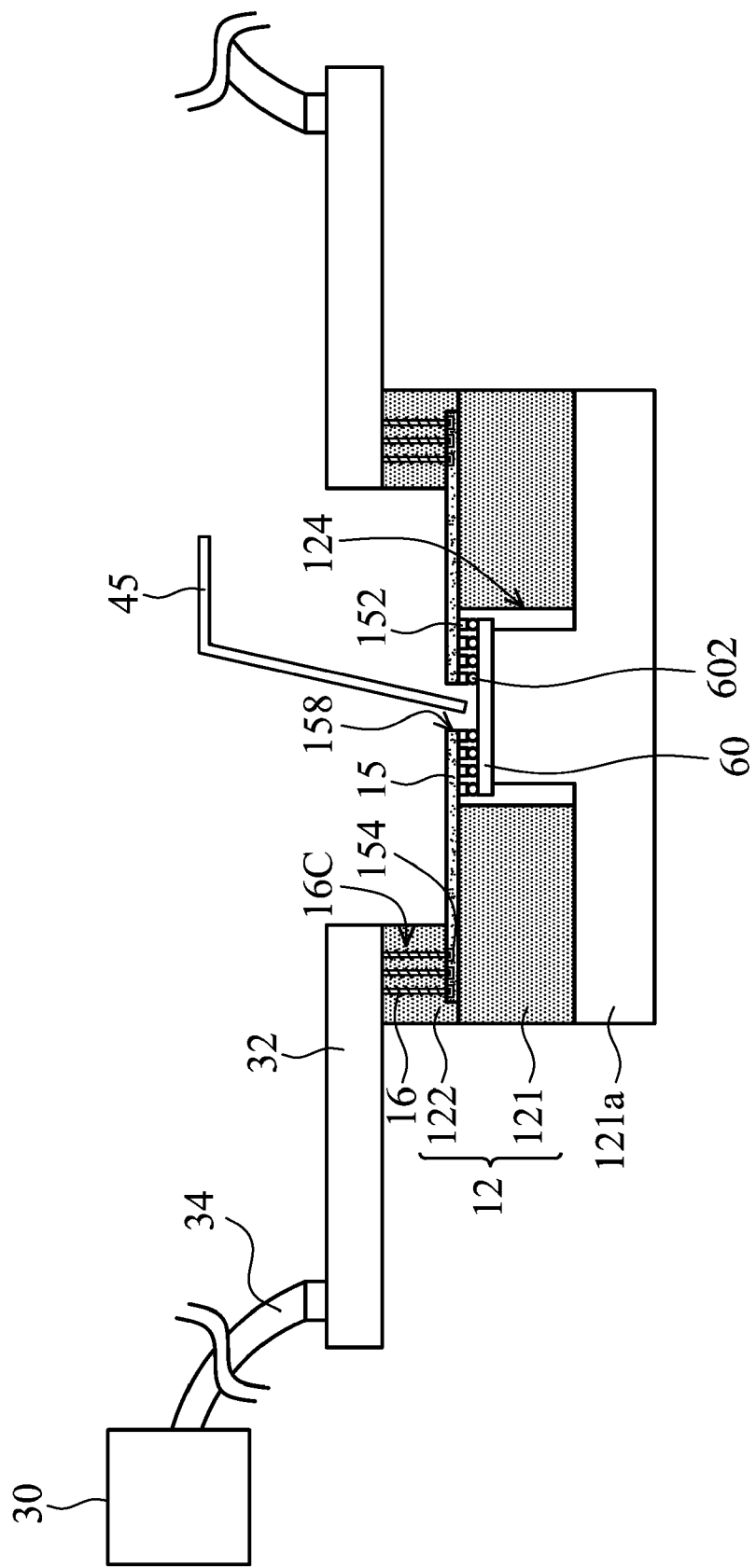
Figure 6B:
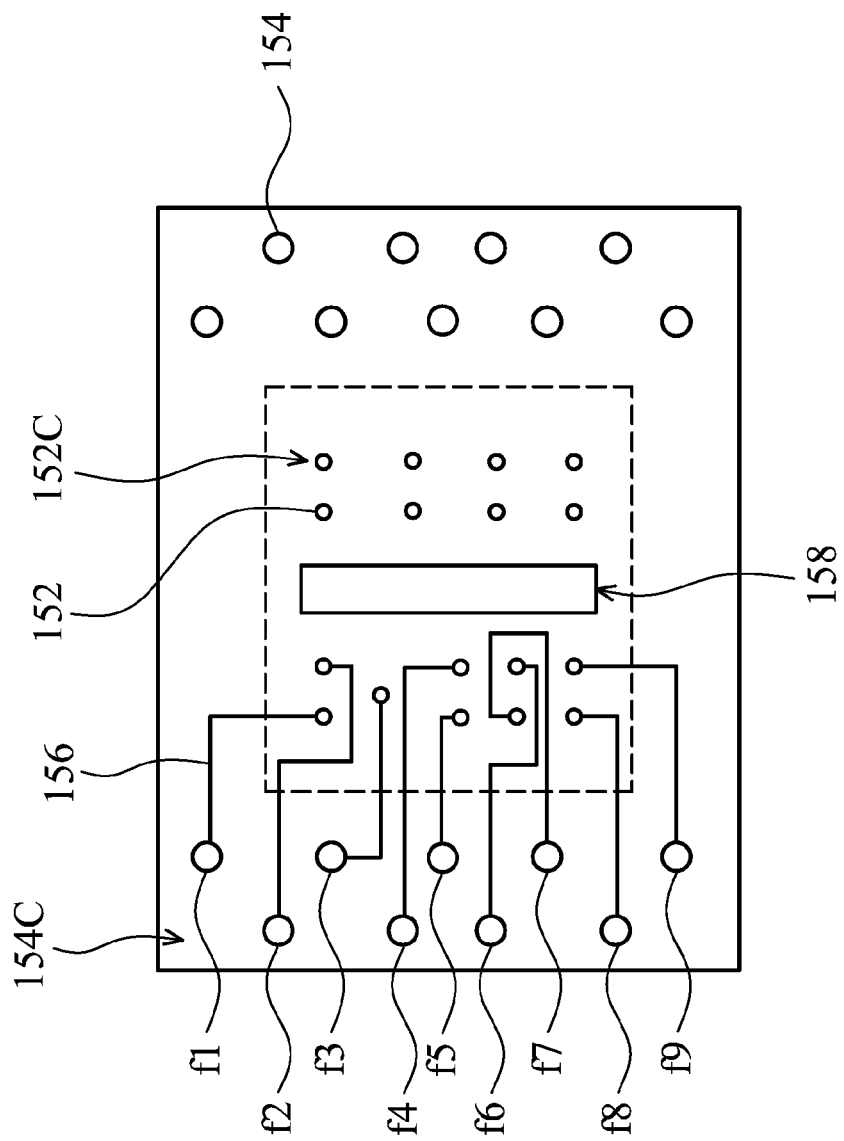

As shown in FIGS. 4B and 6B, a second interchangeable insert board 15 is provided. In one embodiment, a size of the interchangeable insert board 14 and a size of the second interchangeable insert board 15 are substantially the same. The second interchangeable insert board 15 is an insulating board having conducting patterns formed therein. The conducting patterns comprise a plurality of third contact pads 152, a plurality of fourth contact pads 154, and a plurality of trace layers 156. Then, the second interchangeable insert board 15 is disposed between the first portion 121 and the second portion 122 of the test socket 12 and the second electronic device package 60 is disposed in the recess 124, wherein the second external terminals 602 are facing upwards to electrically contact with the third contact pads 152. The third contact pads 152 are arranged in a third pad configuration 152c and facing the recess 124, wherein the third pad configuration 152c is compatible with the second terminal configuration 602c.

The fourth contact pads 154 are arranged in a fourth pad configuration 154c compatible with the pin configuration 16c of the contact pins 16. Thus, the fourth pad configuration 154c of the fourth contact pads 154 of the second interchangeable insert board 15 and the second pad configuration 144c of the second contact pads 144 of the interchangeable insert board 14 are substantially the same. FIG. 6B shows a top view of the interchangeable insert board 15. Each of the contact pins 16 electrically contacts with a specific fourth contact pad 154, which is electrically connected to a specific third contact pad 156 through a specific trace layer 156. For example, through a specific trace layer 156 and a specific third contact pad 152, the second external terminals 602 having a first function (f1) is electrically connected to a specific fourth contact pad 154 (also labeled as f1), which corresponds to a specific contact pin 16. Thus, each of the contact pins 16 is electrically coupled to a predetermined second external terminal 602 having a specific function. The second electronic device package 60 may thus be subjected to electrical and/or reliability tests by the test machine 30 through the electrical paths provided by the contact pins 16 and the interchangeable insert board 15. Only the distribution of the third contact pads 152 and the layout of the trace layers 156 are necessary to be tuned to receive the second external terminals 602 and lead each of the second external terminals 602 to the corresponding fourth contact pads 154, respectively. Because the fourth pad configuration 154c of the fourth contact pads 154 and the pin configuration of the contact pins 16 are the same, the test apparatus 10 described in FIG. 4A can be directly used to perform a test to the second electronic device package 60. There is no need to form a new test socket with a new pin configuration. Testing tool cost can be significantly reduced.

Also, an internal probing test may be optionally performed. In this case, an opening 158 may be formed in the second interchangeable insert board 15 to expose a portion of the second electronic device package 60 to be tested. In addition, a probe opening 648 is formed through the exposed portion of the first electronic device package 60 to be tested, as shown in FIG. 5C. For example, a patterning process such as a photolithography process may be performed to form the probe opening 648. It should be appreciated that it is preferable that the location of the probe opening 648 does not overlap with the locations of the second external terminals 602. As shown in FIGS. 4B and 5C, an internal probe pin 45 is disposed into the opening 158 and the probe opening 648 (see FIG. 5C) to perform the internal probing test.

The test apparatus may be suitable for testing many kinds of electronic device packages having different external terminal configurations and/or different external terminal definitions. It is possible that only the interchangeable insert board is needed to be changed while all the other test elements including the test socket, the interface printed circuit board, and the test machine may remain the same.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test apparatus for an electronic device package, comprising:
   a test socket having a first portion and a second portion overlying the first portion, wherein the first portion has a recess for receiving an electronic device package to be tested having a plurality of external terminals arranged in a terminal configuration;
   an interchangeable insert board disposed between the first portion and the second portion and partially extended on the recess, wherein the interchangeable insert board comprises:
   a plurality of first contact pads arranged in a first pad configuration compatible with the terminal configuration and facing the recess;
   a plurality of second contact pads arranged in a second pad configuration and disposed between the first portion and the second portion; and a plurality of trace layers each electrically connecting one of the first contact pads to one of the second contact pads, respectively; and a plurality of contact pins each penetrating through the second portion and electrically connected to one of the second contact pads of the interchangeable insert board, wherein the contact pins are arranged in a pin configuration, and the second pad configuration is compatible with the pin configuration.

2. The test apparatus for an electronic device package as claimed in claim 1, further comprising:

an interface printed circuit board electrically connected to the contact pins; and a test machine electrically coupled to the interface printed circuit board.

3. The test apparatus for an electronic device package as claimed in claim 1, wherein the interchangeable insert board further comprises an opening for exposing a portion of the electronic device package to be tested.

4. The test apparatus for an electronic device package as claimed in claim 1, wherein the first portion of the test socket comprises a heat transfer element for conducting heat energy to or from the electronic device package to be tested.

5. The test apparatus for an electronic device package as claimed in claim 4, wherein a surface of the heat transfer element is located at a bottom portion of the recess.

6. The test apparatus for an electronic device package as claimed in claim 1, wherein the contact pins comprise a pogo pin.

7. The test apparatus for an electronic device package as claimed in claim 1, wherein the electronic device package to be tested comprises a BGA package or a PGA package.

8. The test apparatus for an electronic device package as claimed in claim 1, wherein the external terminals comprise a solder ball.

9. The test apparatus for an electronic device package as claimed in claim 1, wherein the electronic device package to be tested comprises a DRAM package.

10. The test apparatus for an electronic device package as claimed in claim 1, wherein the interchangeable insert board comprises a printed circuit board.

11. A method for testing an electronic device package, comprising:

providing a first electronic device package to be tested having a plurality of first external terminals arranged in a first terminal configuration;

providing a test socket having a first portion and a second portion overlying the first portion, wherein the first portion has a recess for receiving an electronic device package to be tested;

disposing an interchangeable insert board between the first portion and the second portion, wherein the interchangeable insert board is partially extended on the recess and comprises:

a plurality of first contact pads arranged in a first pad configuration compatible with the first terminal configuration and facing the recess;

a plurality of second contact pads arranged in a second pad configuration and disposed between the first portion and the second portion of the test socket; and a plurality of trace layers each electrically connecting one of the first contact pads to one of the second contact pads, respectively;

providing a plurality of contact pins each penetrating through the second portion of the test socket and electrically connected to one of the second contact pads of the interchangeable insert board, wherein the contact pins are arranged in a pin configuration, and wherein the second pad configuration is compatible with the pin configuration; and disposing the first electronic device package into the recess to make each of the first external terminals electrically connect to one of the first contact pads, respectively.

12. The method for testing an electronic device package as claimed in claim 11, further comprising:

providing an interface printed circuit board electrically connected to the contact pins; and providing a test machine electrically coupled to the interface printed circuit board.

13. The method for testing an electronic device package as claimed in claim 11, wherein the interchangeable insert board further comprises an opening exposing a portion of the first electronic device package to be tested.

14. The method for testing an electronic device package as claimed in claim 13, further comprising:

forming a probe opening through the exposed portion of the first electronic device package to be tested; and disposing an internal probe pin into the probe opening to perform internal probing of the first electronic package.

15. The method for testing an electronic device package as claimed in claim 11, wherein the first portion of the test socket comprises a heat transfer element for conducting heat energy to or from the electronic device package to be tested.

16. The method for testing an electronic device package as claimed in claim 15, further comprising heating or cooling the first electronic device package to be tested by the heat transfer element.

17. The method for testing an electronic device package as claimed in claim 11, further comprising:

removing the first electronic device package and the interchangeable insert board;

providing a second electronic device package to be tested, wherein the second electronic device package to be tested has a plurality of second external terminals arranged in a second terminal configuration;

disposing a second interchangeable insert board between the first portion and the second portion, wherein the second interchangeable insert board is partially extended on the recess and comprises:

a plurality of third contact pads arranged in a third pad configuration compatible with the second terminal configuration and facing the recess;

a plurality of fourth contact pads arranged in a fourth pad configuration and disposed between the first portion and the second portion of the test socket, wherein the fourth pad configuration and the second pad configuration are substantially the same; and a plurality of second trace layers each electrically connecting one of the third contact pads to one of the fourth contact pads, respectively; and disposing the second electronic device package into the recess to make each of the second external terminals electrically connected to one of the third contact pads, respectively, wherein after the second interchangeable insert board is disposed between the first portion and the second portion, each of the contact pins is electrically connected to one of the fourth contact pads of the second interchangeable insert board, and the fourth pad configuration is compatible with the pin configuration.

18. The method for testing an electronic device package as claimed in claim 17, wherein a size of the interchangeable insert board and a size of the second interchangeable insert board are substantially the same.

19. The method for testing an electronic device package as claimed in claim 11, wherein the electronic device package to be tested comprises a BGA package or a PGA package.

20. The method for testing an electronic device package as claimed in claim 11, wherein the electronic device package to be tested comprises a DRAM package.

* * * * *